United States Patent
Kumar et al.

(10) Patent No.: US 6,593,776 B2
(45) Date of Patent: Jul. 15, 2003

(54) METHOD AND APPARATUS FOR LOW POWER DOMINO DECODING

(75) Inventors: Sudarshan Kumar, Fremont, CA (US); Gaurav Mehta, Folsom, CA (US); Vivek Joshi, Sunnyvale, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/922,434

(22) Filed: Aug. 3, 2001

(65) Prior Publication Data

US 2003/0025531 A1 Feb. 6, 2003

(51) Int. Cl.[7] .................................................. H03K 19/94
(52) U.S. Cl. ........................ 326/105; 326/106; 326/107; 326/108
(58) Field of Search ................................. 326/105–108; 365/230.06

(56) References Cited

U.S. PATENT DOCUMENTS 5,077,495 A * 12/1991 Torimaru et al. ............ 307/449
5,970,018 A * 10/1999 Iwata et al. ............... 365/230.6
5,982,702 A * 11/1999 Bosshart ................. 365/230.06

* cited by examiner

*Primary Examiner*—Michael Tokar
*Assistant Examiner*—Anh Tran
(74) *Attorney, Agent, or Firm*—Cynthia T. Faatz

(57) ABSTRACT

A decoder includes multiple decode gates, each to provide one bit of a decoded output signal. At least two of the decode gates share a transistor. According to one aspect, each of the multiple decode gates is a skewed gate.

21 Claims, 8 Drawing Sheets

3:8 SKEWED GATE DECODER 425

METHOD AND APPARATUS FOR LOW POWER DOMINO DECODING

BACKGROUND

1. Field

An embodiment of the present invention relates to the field of decoding, and, more particularly, to a low power domino decoding approach.

2. Discussion of Related Art

For microprocessors and other integrated circuits, designers continue to focus on reducing delays to provide increasingly faster integrated circuits.

Additionally, increasing power consumption of microprocessors and other integrated circuits (ICs) has become one of the major issues for current and next generation designs. Power-related costs (e.g. cooling and power delivery) can have a significant impact on the overall cost of an integrated circuit chip and, therefore, cut into profit margins in an increasingly competitive marketplace. Additionally, high power consumption and junction temperatures can limit the performance of high-end microprocessors and other ICs.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for low power domino decoding is described. In the following description, particular types of integrated circuits and circuit configurations are described for purposes of illustration. It will be appreciated, however, that other embodiments are applicable to other types of integrated circuits, and to circuits configured in another manner.

For one embodiment, each of a plurality of decode gates provides one bit of a decoded output signal. The decoded output signal may be the final output of the decoder or it may be an output of an intermediate stage of the decoder such as the output of a predecoder stage. At least one of the plurality of decode gates shares at least one transistor with at least one other of the plurality of decode gates. Further details of this and other embodiments are provided in the description that follows.

For purposes of example, embodiments of the invention are described below in reference a microprocessor. It will be appreciated, however, that other embodiments may be applicable to decoding circuitry on a different type of processor or another type of integrated circuit chip.

Figure 1:
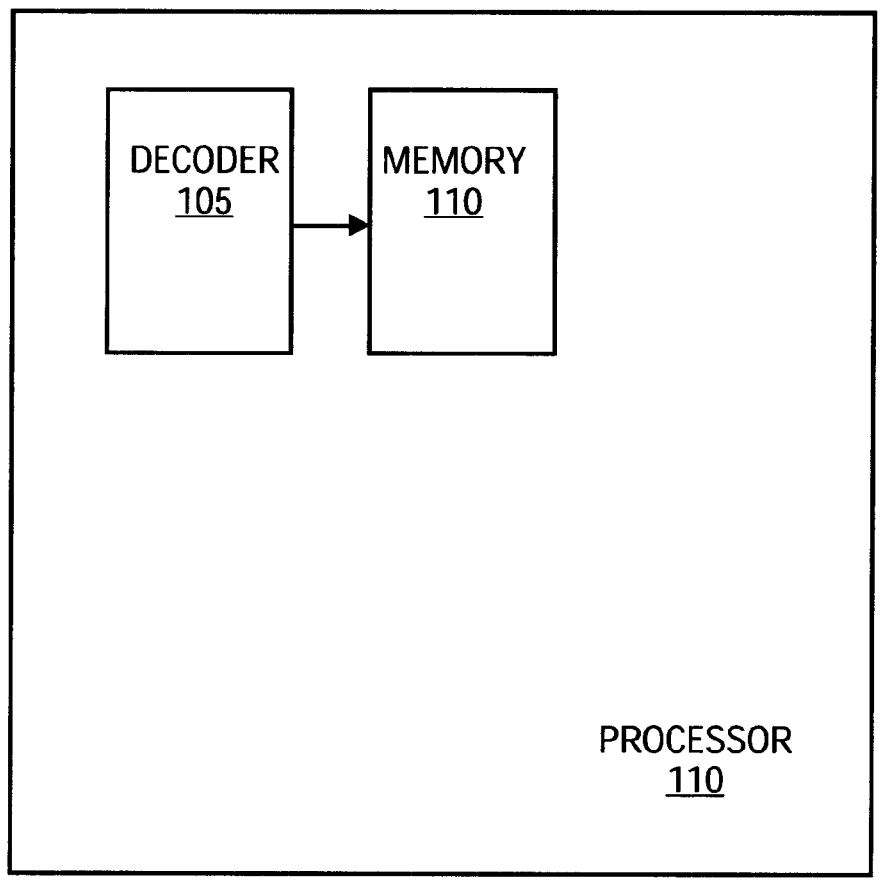
FIG. 1 is a block diagram of a processor in which the low power decoding approach of one embodiment may be advantageously used.

FIG. 1 is a block diagram of a processor 100 in which the low power domino decoding approach of one embodiment may be advantageously used. For one embodiment, the processor 100 is a microprocessor. For other embodiments, however, the processor may be a different type of processor such as, for example, a digital signal processor. The processor 100 includes a decoder 105 that is coupled to, or, is a part of, a memory 110. For this embodiment, the decoder 105 may be used to decode addresses indicated by memory access instructions directed to the memory 110, for example. The memory 110 may be any type of memory such as a register file, a cache memory, etc.

For other embodiments, the decoder 105 may be used to decode signals directed to a different type of unit such as, for example, a multiplexer, a priority decoder, etc. Further, for other embodiments, the decoder 105 may be used on a different type of integrated circuit other than a processor.

It will be appreciated that the processor 100 includes other circuitry and/or other types of functional units not shown in FIG. 1.

Figure 2:
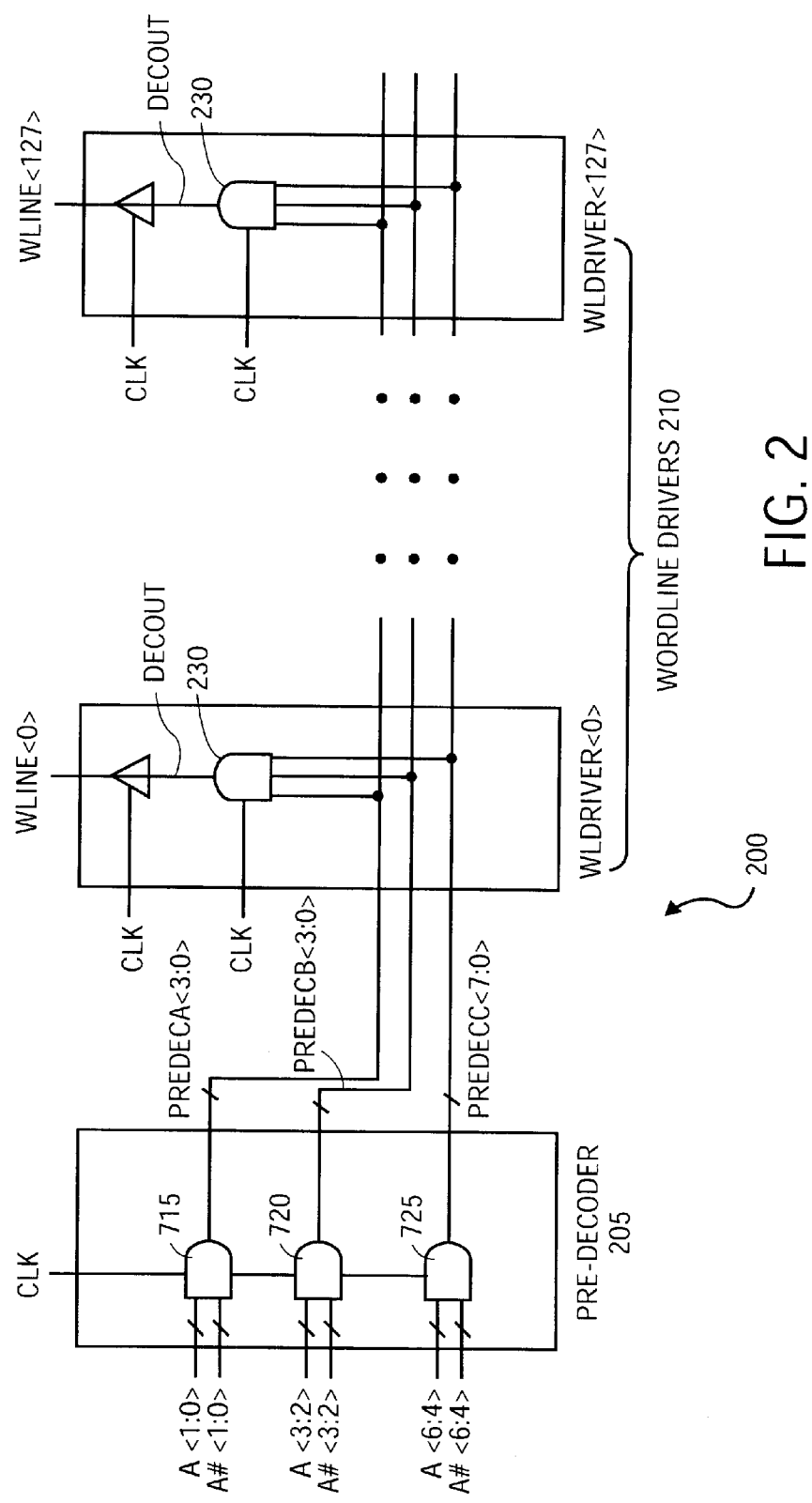
FIG. 2 is a schematic diagram showing the structure of a prior decoding approach.

FIG. 2 is a schematic diagram of a prior decoder unit 200. The decoder unit 200 is an example of a decoder that may typically be used to perform a function similar to the decoder 105 of FIG. 1. This exemplary decoder unit 200 is a 7:128 decoder, but other types of decoders may be implemented in a similar manner.

The decoder unit 200 includes a pre-decoder 205 and word line drivers 210 (WLDrivers <0:127>). The pre-decoder 205 of this example includes two 2:4 decoders 215 and 220 and a 3:8 decoder 225, each represented by a respective AND gate in FIG. 2. The pre-decoder 205 receives a 7-bit address signal, A<6:0> (or other signal to be decoded) and its complement A#<6:0> as shown, and provides a 16-bit output signal in the form of three multi-bit pre-decode signals: PREDECA<3:0>, PREDECB<3:0>, and PREDECC<7:0>.

Each of the word line drivers WLDriver <0:127> receives one bit of each of the three multi-bit pre-decode signals PREDECA<3:0>, PREDECB<3:0>, and PREDECC<7:0> at each of three inputs of a corresponding 3-input NAND gate 230 that provides the final decode stage. A decoded output signal (DECOUT) is then provided at an output of each of the three input NAND gates 230 responsive to the input signal ADDR<6:0>, and, in response to a clock signal CLK, the decoded word line signals WLINE<0:127> are driven out by the corresponding word line drivers WLDriver<0:127>.

Figure 3:
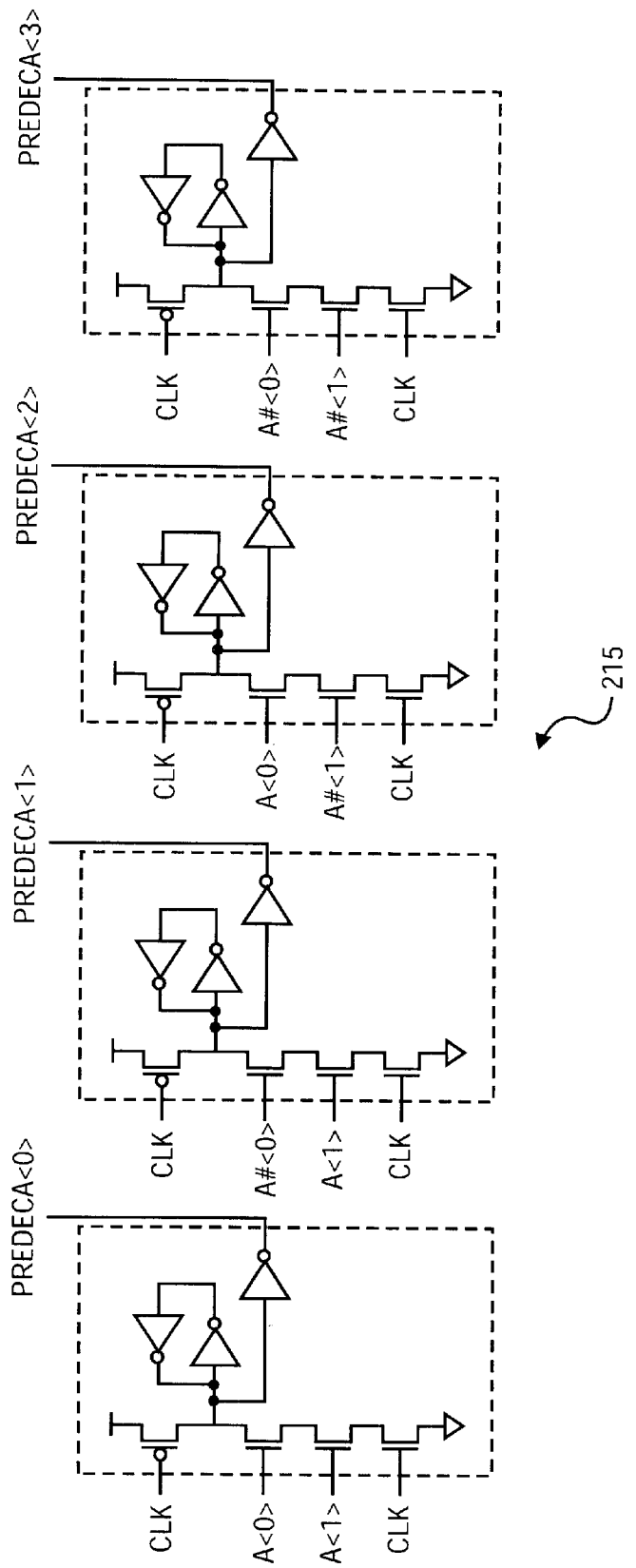
FIG. 3 is a schematic diagram of a pre-decoder stage that may be used in the prior decoding approach of FIG. 2.

For the decoder unit 200 shown in FIG. 2, the decoders 215, 220, 225 and the three input NAND gates (or 3:1 decoders) 230 are each implemented using traditional D1 or D2 domino gates that are clocked with a precharge or other clock signal CLK. An example of a D1 domino implementation of the 2:4 decoder 215 in the pre-decoder 205 is shown in FIG. 3. Other decoders within the decoder 200 may be implemented using a similar approach.

Figure 4:
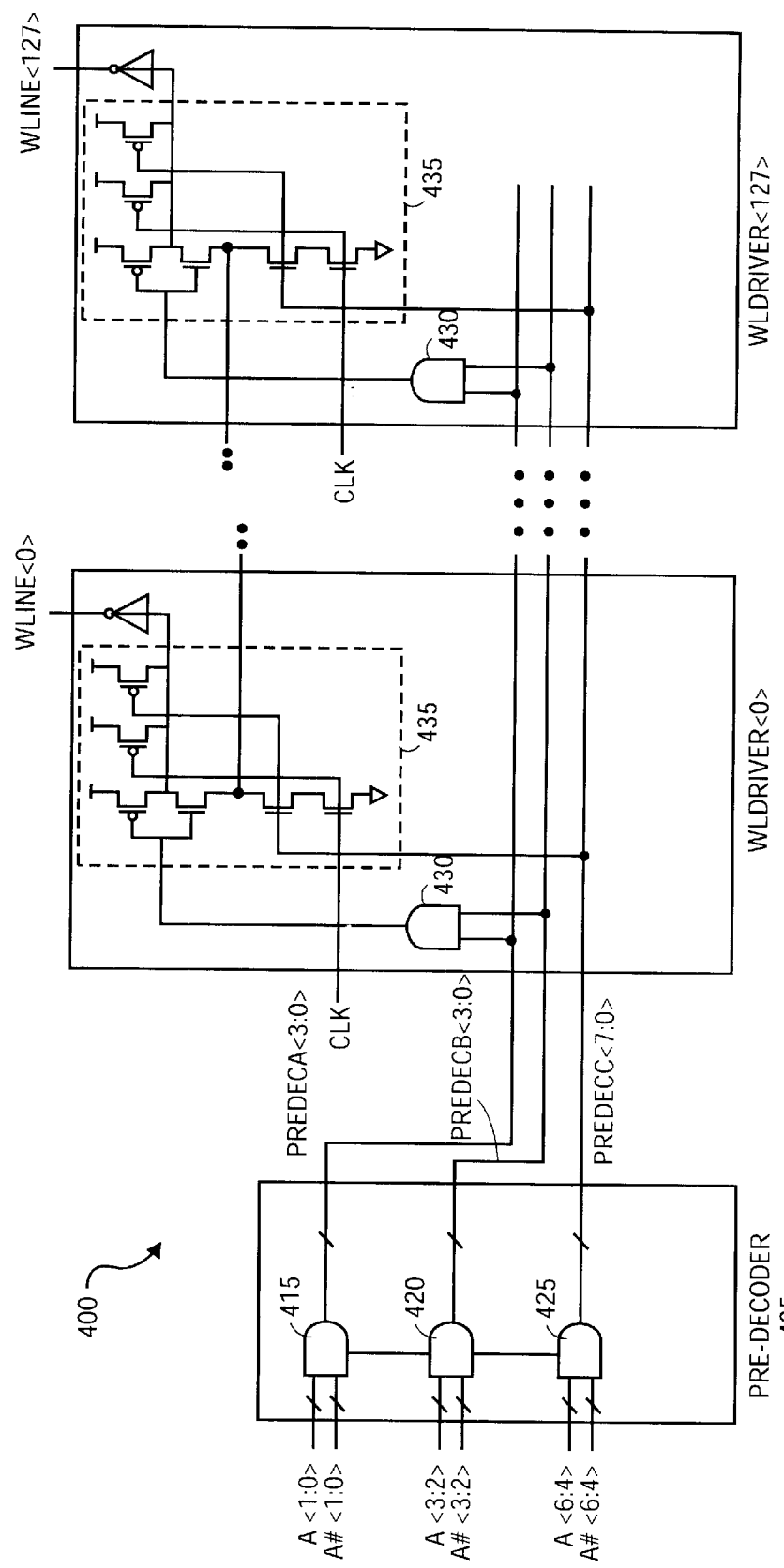
FIG. 4 is a schematic diagram of low power domino decoding approach of one embodiment.

FIG. 4 is a schematic diagram of a low power domino decoder 400 in accordance with one embodiment that may be used to provide the decoder 105 of FIG. 1 or another type of decoder. In contrast to the decoder 200 of FIG. 2, for the decoder 400, skewed complementary metal oxide semiconductor (CMOS) gates are used in place of one or more of the D1 and/or D2 domino gates of the decoder 200.

The decoder 400 of FIG. 4, for example, like the decoder 200 of FIG. 2, includes a first decode stage, referred to in this example as a pre-decoder or pre-decode stage 405, and a group of second decode stages included in word line drivers 410 (WLDriver <0:127>). The pre-decode stage 405 for this exemplary embodiment includes two 2:4 decoders 415 and 420 and one 3:8 decoder 425. For the decoder 400 of FIG. 4, however, the decoders 415, 420 and 425 are each implemented using skewed CMOS gates instead of D1 and/or D2 domino gates. Like the pre-decoder 205, the pre-decoder 405 receives a 7-bit address or other signal to be decoded, A<6:0> and its complement A#<6:0> as shown, and provides a 16-bit output signal in the form of three multi-bit pre-decode signals: PREDECA<3:0>, PREDECB<3:0>, and PREDECC<7:0>.

Figure 5:
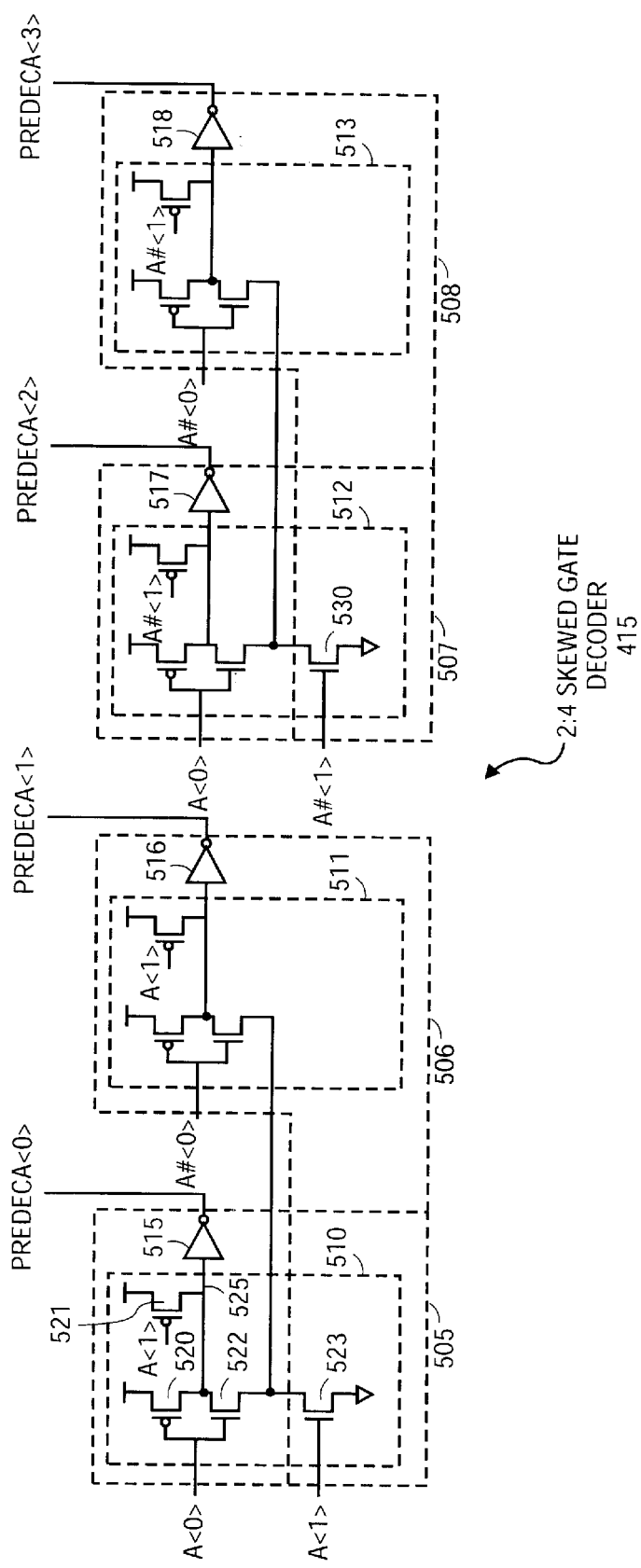
FIG. 5 is a schematic diagram of a 2:4 decoder in accordance with one embodiment that may be used in the decoder of FIG. 4.

FIG. 5 is a schematic diagram showing the 2:4 decoder 415 of one embodiment in more detail. The 2:4 skewed gate decoder 415 includes four decode gates 505–508. Each of the four decode gates 505–508 provides one bit of the decoded (or, in this case, pre-decoded) output signal PREDECA<3:0> at its output as shown.

Each of the decode gates 505–508 of this embodiment includes a respective low skew decode gate 510–513 coupled to a high skew inverter 515–518. The decode gate 505, for example, includes the low skew decode gate 510 coupled to a high skew inverter 515.

The low skew decode gate 510 is a NAND gate and includes p-type transistors 520 and 521 and n-type decode pull-down transistors 522 and 523. "Low skew" as the term is used herein refers to a gate having transistors sized such that a signal transition from high to low at an output of the gate occurs faster than a transition from low to high at the same output. Thus, for the low skew decode gate 510, the n-type decode transistors 522 and 523 are sized relative to the p-type transistors 520 and 521 such that a signal transition from high to low at an output 525 occurs in less time than a signal transition from high to low at the output 525.

For one embodiment, the sizing of the n-type decode transistors 522 and 523 is determined according to the amount of delay that can be tolerated in the overall circuit. The p-type transistors are typically 2–3.5× slower than the n-type transistors and thus, for equal rise and fall times, the p-type transistors might be sized to be approximately 2–3.5× bigger than the n-type transistors. For the low skew gates of one embodiment, however, the p-type devices are sized down from that point such that a high to low transition at an output of the skewed gate occurs faster than a low to high transition. As the p-type devices are sized down, noise is used as a limiting factor to determine the extent to which they can be sized down.

With continuing reference to FIG. 5, the inverter 515 is coupled to the output 525 of the low skew gate 510. The inverter 515 for this embodiment is a high skew gate as mentioned above. "High skew" as the term is used herein refers to a gate for which a signal transition from low to high at an output of the gate is faster than a transition from high to low. Thus, for the high skew gate 515, a transition of the PREDECA<0> signal from low to high is faster than a transition of the PREDECA<0> signal from high to low.

For the high skew gate 515 then, the p-type pull-up transistor of the inverter 515 is sized to be stronger than the n-type pull-down transistor of the inverter 515. For one embodiment, for a high skew gate, the p-type transistor(s) may be initially sized to be 2–3.5× the size of the n-type transistor(s) in the gate and then sized up from there. Noise is again used as a limiting factor to determine how large the p-type device(s) can be relative to the n-type device(s). Desired speed of the gate is also a consideration.

While only the decode gate 505 is described above, it will be appreciated that similar relative sizing considerations apply to the other decode gates 506–508.

Unlike the D1 and/or D2 domino gates of the decoder 200 of FIG. 2, the skewed decode gates 505–508 do not need a precharge clock transistor. This is because precharging of the outputs of the skewed gates is accomplished by the data inputs of the skewed gates.

Referring again to the skewed decode gate 505 for purposes of example, the input signals A<0> and A<1> to the low skew gate 510 are received from a prior domino stage (not shown), a latch (not shown) or an inverter following a prior domino stage (not shown) for one embodiment. During precharging of the prior domino stage, both of the input signals A<0> and A<1 > are pulled low. Pulling the signals A<0> and A<1 > low causes the output 525 of the low skew gate to be pulled high such that it is precharged in preparation for a subsequent evaluation phase. Other low skew gates 511–513 are precharged in a similar manner. For one embodiment, the complementary signals are complementary during an evaluate phase of the decoder 415 and not during a precharge phase such that all decode gates 505–508 may be precharged in response to the input signals.

In operation then, precharging of a prior domino stage (not shown) coupled to inputs of the skewed gate decoder 415 causes the low skew gates 510–513 to be precharged high which causes all of the outputs PREDECA<3:0> to be pulled low.

During a subsequent evaluation phase for the prior domino stage, the data input signals A<1:0> and A#<1:0> transition to indicate an address or other input data and its complement at the inputs to the skewed gate decoder 415. In response, an output of only one of the skewed decoder gates 510–513 transitions low. This transition from high to low happens relatively quickly due to the low skew nature of the respective one of the decoder gates 510–513.

In response to the high to low transition of an output of one of the skewed decoder gates 510–513, the corresponding one of the PREDECA<3:0> outputs indicated by the address or other input signal A<1:0> transitions from low to high. Due to the fact that the inverters 515–518 are high skew inverters, this transition also happens relatively quickly.

Thus, once a prior domino stage (not shown) evaluates, the decoded output signal PREDECA<3:0> is available with very little delay.

With continuing reference to FIG. 5, due to the fact that the PREDECA<3:0> signals are mutually exclusive, i.e. only one of the PREDECA<3:0> output signals can be asserted in any given clock cycle, one or more decode transistors can be shared between one or more of the decode gates 505–508. For example, the decode transistor 523 is shared by skewed decode gates 510 and 511. Similarly, a decode transistor 530 is shared by skewed decode gates 512 and 513.

Referring back to FIG. 4, the decoder 420 may be implemented in a similar manner to the decoder 415 discussed above. For the embodiment shown in FIG. 4, the 3:8 decoder 425 may be implemented as shown in FIG. 6.

Figure 6:
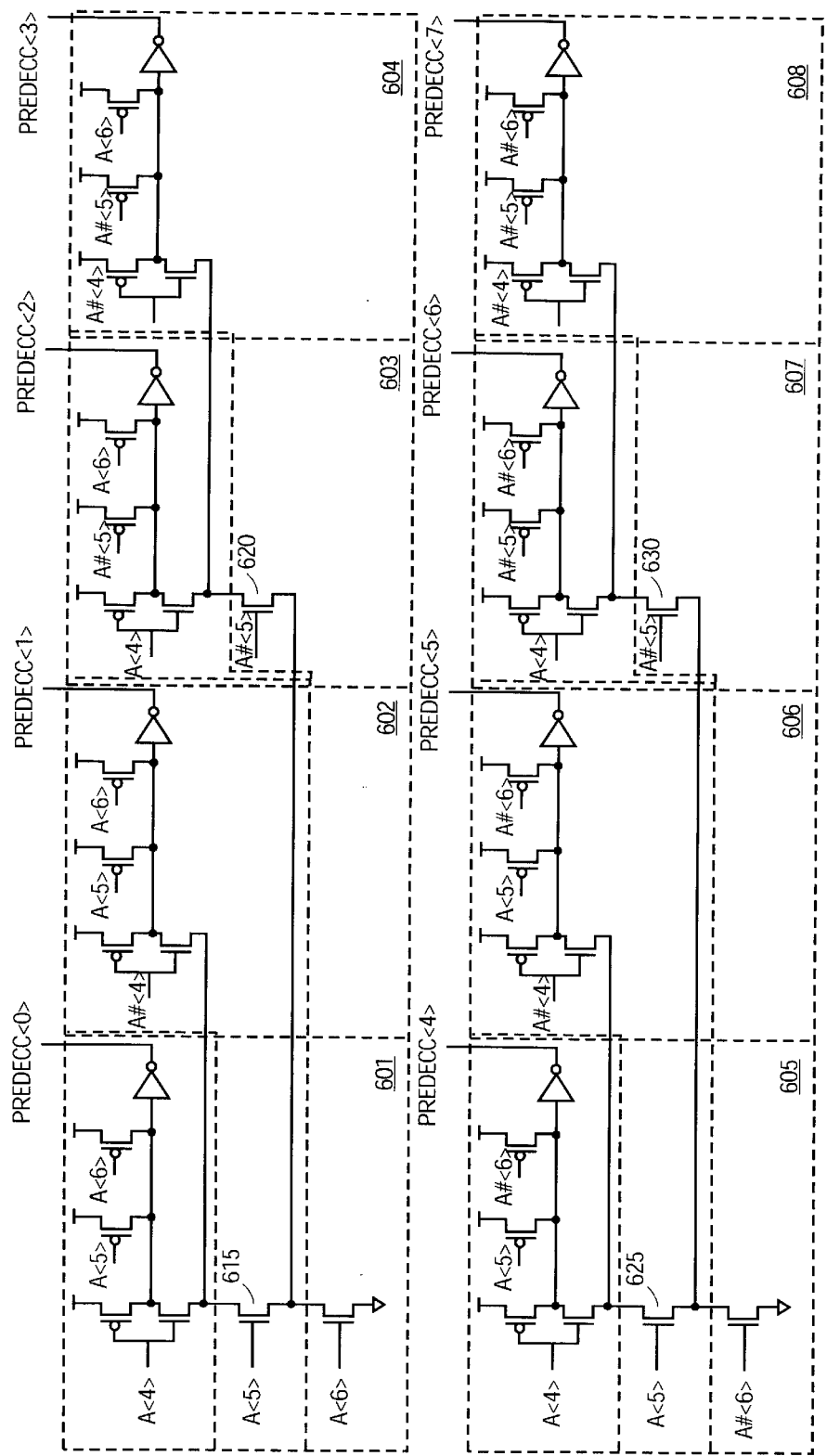
FIG. 6 is a schematic diagram of a 3:8 decoder in accordance with one embodiment that may be used in the decoder of FIG. 4.

As shown in FIG. 6, the 3:8 skewed gate decoder 425 includes 8 static skewed decode gates 601–608 each of which, for this embodiment, includes a low skew decode gate and a high skew inverter as for the decoder 415 of FIG.

4. Relative sizing considerations for the p-type and n-type transistors are similar to those discussed above.

For the 3:8 decoder, the benefit of sharing decode pull-down gates across multiple bits of decode may be even larger. For example, decode pull-down gates 605 and 610 are each shared by four decode gates, while decode pull-down gates 615, 620, 625 and 630 are each shared by two decode gates as shown.

Sharing decode transistors across multiple bits of decode logic may reduce circuit loading and conserve valuable routing space. Further, it may be possible using this approach for multiple signals to share a routing track.

For example, referring to FIG. 5, if the input that receives the A<1> signal only needs to be routed to the gate 523 instead of also being routed to a similar gate in the skewed decode gate 511 that is further away, it may be possible for the input that receives the A#<1> signal at the transistor 530 to use the same routing track.

The ability to share decode transistors may also help to increase noise immunity and decrease the size of the decoder 415 as compared to, for example, the decoder 200 of FIG. 2.

Referring again to FIG. 4, the word line drivers 410 of the exemplary embodiment shown in FIG. 4 may also be implemented in a different manner. For one embodiment, as shown, each of the word line drivers 410 includes a second decode stage that is implemented through a combination of a skewed decode gate 430 and a domino gate 435 that receives a clock signal clk. For this embodiment, each of the skewed gates 430 may comprise a low skew NAND gate coupled to a high skew inverter, for example, similar to the decoders of FIGS. 5 and 6.

For this implementation, a majority of the gates in the decoder 400 are static with only the final gate being a domino gate. Thus, noise immunity of the decoder 400 may be improved as compared to the domino decoder 200 of FIG. 2.

Further, by eliminating precharge clock transistors from one or more decode gates, the decoder 400 may be capable of lower power operation as compared to the decoder 200 of FIG. 2 due to reduced clock loading.

The decoder 400 may also be capable of faster operation as compared to the decoder 200 of FIG. 2. This is because the inputs to the domino gate 435 may be set up more quickly than the inputs to the final domino stage for the decoder 200, for example (i.e. the buffer providing the WLINE signal at its output). Therefore, it may be possible for the final decode stage including the domino circuit 435 to evaluate earlier than the corresponding final decoding stage of the decoder circuit 200. Further, because fewer devices need to be driven as compared to a conventional decoder providing the same operation, load capacitance may be lower.

Figure 7:
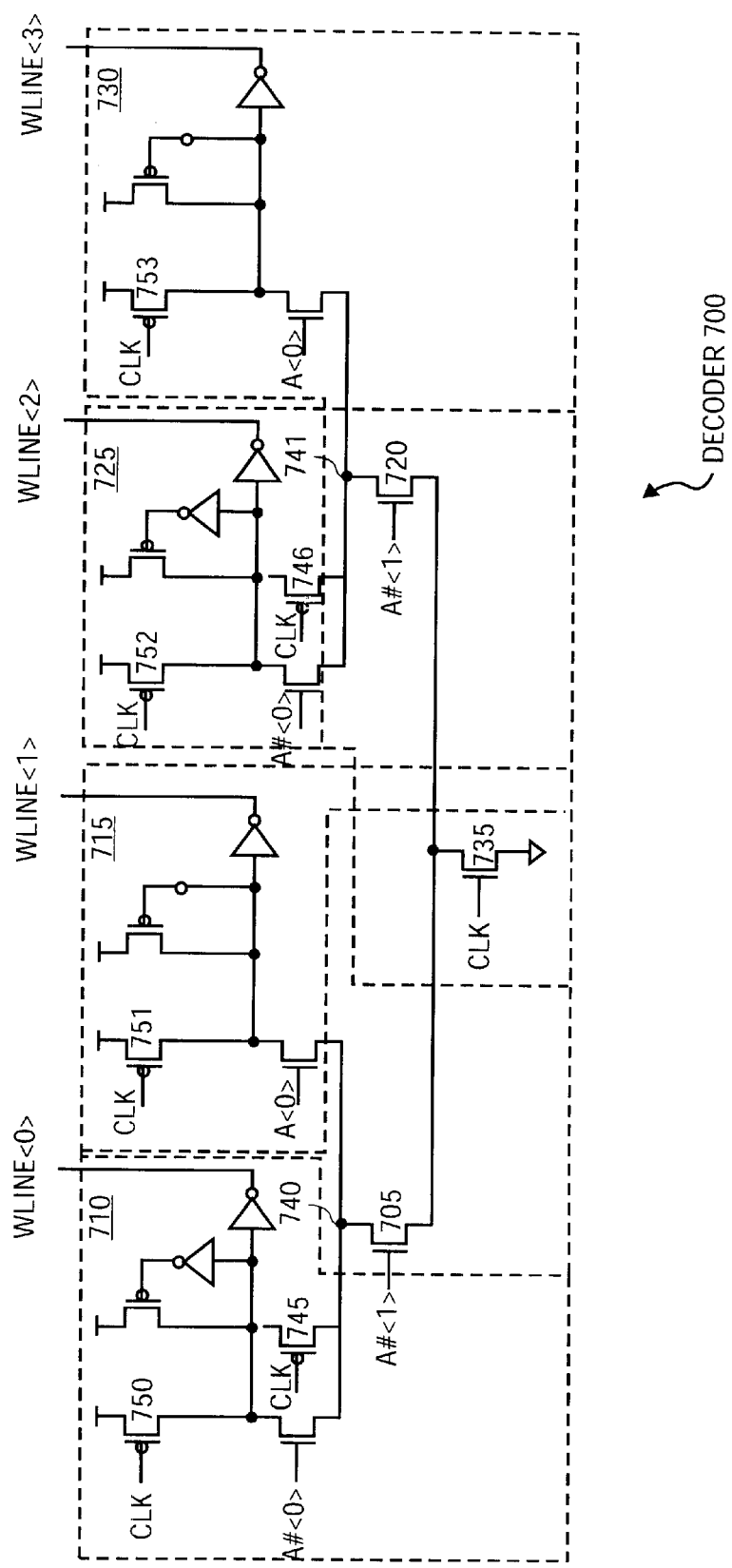
FIG. 7 is a schematic diagram of a 2:4 decoder and word line driver that may be used in the decoder of FIG. 4.

FIG. 7 is a schematic diagram of an exemplary low power domino decoder 700 of another embodiment. For the decoder 700, a similar transistor sharing approach is used to include multiple stages of decode logic in the word line drivers.

The exemplary decoder 700 is a low power 2:4 decoder with word line driver logic, however, other sizes of decoders may be implemented in a similar manner and/or the decoder 700 may be part of a larger decoder for another embodiment. The decoder 700 receives a two-bit address or other input signal A<1:0> and its complement A#<1:0> and provides a four-bit word line output signal WLINE <0:3>.

The decoder 700 like the decoders 415 of FIG. 5 and the decoder 425 of FIG. 6 shares decode transistors across multiple bits of decode logic. For example, decode transistor 705 is shared between decode gates 710 and 715 providing the WLINE<0> and the WLINE<1> signals, respectively, and decode transistor 720 is shared between decode gates 725 and 730 that provide the WLINE <2> and WLINE <3> signals, respectively. Additionally, for this embodiment, an evaluate transistor 735 that receives a clock signal CLK is shared between all four decode gates 710, 715, 725 and 730 as shown. These decode and evaluate transistors can be shared across decode gates because only one of the decode gates will evaluate low for any given clock cycle.

Further, similar to the decode gates of other embodiments described above, the decode gates of the decoder 700 are low skew gates such that a transition from high to low is faster than a transition from low to high at the output of each decode gate.

For the decoder 700 of FIG. 7, to avoid charge sharing and potentially catastrophic failures, internal nodes 740 and 741 of the domino gates are shielded. For one embodiment, this is accomplished by configuring the decoder 700 such that wires adjacent to the internal nodes 740 and 741 do not switch at the same time. One way to address this issue is to route ground wires adjacent to the internal nodes 740 and 741. To further avoid charge sharing issues, secondary precharge devices 745 and 746 are added. For one embodiment, the secondary precharge devices 745 and 746 may be relatively smaller compared to the primary precharge devices 750–753.

Using the configuration shown in FIG. 7, it may be possible to save area as compared to a similarly functioning decoder that does not share transistors across decode gates. Further, because the evaluate transistor is shared across all decode gates, clock loading, and thus power dissipation may be reduced as compared to a conventional domino implementation.

Figure 8:
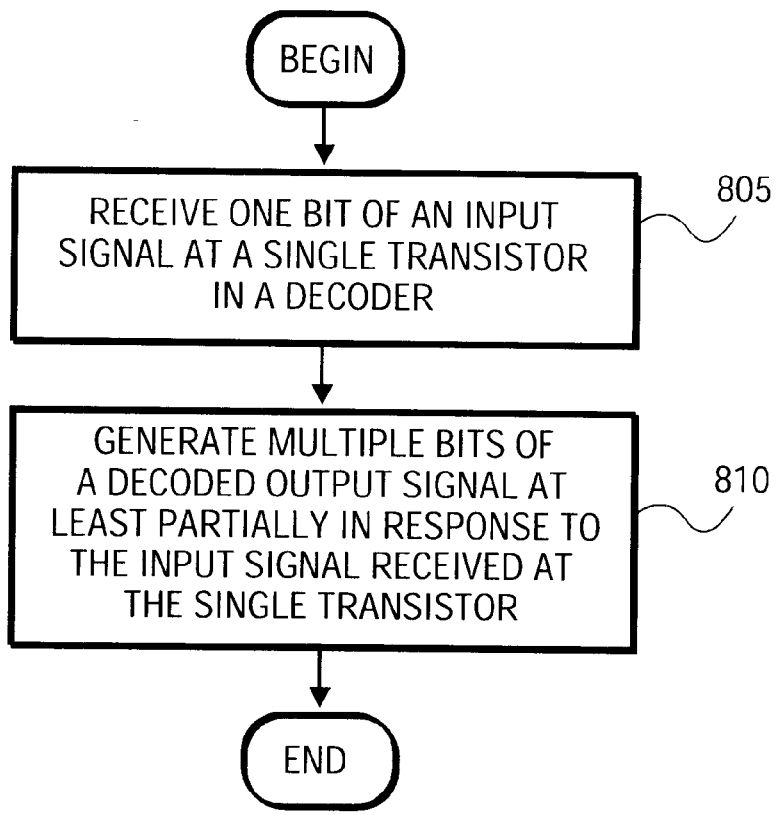
FIG. 8 is a flow diagram showing a method for low power decoding in accordance with one embodiment.

FIG. 8 is a flow diagram showing a method of one embodiment for low power domino decoding. At processing block 805 one bit of an input signal is received at a single transistor in a decoder, and at processing block 810, multiple bits of a decoded output signal are generated at least partially in response to the input signal received at the single transistor.

It will be appreciated that additional actions may be included in the low power decoding method of various embodiments.

In the foregoing specification, the invention has been described with reference to specific exemplary embodiments thereof. It will, however, be appreciated that various modifications and changes may be made thereto without departing from the broader spirit and scope of the invention as set forth in the appended claims. For example, while the skewed gates of the exemplary embodiment are CMOS gates, for other embodiments, a different processing technology may be used. Further, while the gates are precharged high in the exemplary embodiments, for alternative embodiments, complementary logic may be used. For such embodiments, the gates will be skewed in an opposite direction. Also, other decoders with a different number of decoder and/or predecode stages may be used. For such implementations, for one embodiment, the stage immediately preceding the domino stage is implemented using high skew gates and high skew and low skew gates are used alternately from there. Other variations will be appreciated by those of ordinary skill in the art. The specification and drawings are, accordingly, to be regarded in an illustrative rather than a restrictive sense.

What is claimed is:

1. An apparatus comprising:
a decoder including a plurality of decode gates, each decode gate to provide one bit of a decoded output signal, wherein at least two of the decode gates share a transistor and wherein at least one of the decode gates includes a low skew gate.

2. The decoder of claim 1 wherein the low skew gate is precharged by a data signal from prior domino logic.

3. The decoder of claim 2 wherein
an output of the low skew gate is coupled to an input of a high skew gate and wherein an output of the high skew gate is coupled to an input of a domino gate.

4. The decoder of claim 1 wherein the shared transistor is a clocked transistor.

5. The decoder of claim 1 wherein the shared transistor is a decode transistor.

6. An apparatus comprising:
a first decode stage including
at least one static skewed decode gate, the static skewed decode gate being skewed for a transition in a first direction at an output of the static skewed decode gate, the static skewed decode gate to be precharged in response to a non-clock data signal at an input of the static skewed decode gate, and
a static logic gate skewed for a transition in an opposite direction at an output of the logic gate, the static logic gate having an input coupled to the output of the at least one static skewed decode gate.

7. The apparatus of claim 6 wherein
the first decode stage includes at least two static skewed decode gates, the at least two static skewed decode gates sharing a transistor.

8. The apparatus of claim 7 wherein
the transistor shared by the at least two static skewed decode gates is a decode transistor.

9. The apparatus of claim 6 wherein
the first decode stage is a predecode stage.

10. A decoder comprising:
a first decode stage including a plurality of low skew decode gates, each of the low skew decode gates having an output coupled to an associated high skew inverter; and
a second decode stage coupled to the first decode stage, the second decode stage including a plurality of low skew decode gates, each of the low skew decode gates having an output coupled to an associated high skew gate, each of the high skew gates having an output coupled to an associated domino gate, outputs of the domino gates to provide a decoded output signal.

11. The decoder of claim 10 wherein
at least one of the plurality of low skew decode gates in the first decode stage includes at least one decode transistor that is shared with another one of the plurality of low skew decode gates in the first decode stage.

12. The decoder of claim 11 wherein
at least one of the plurality of low skew decode gates in the second decoder stage includes at least one decode transistor that is shared with another one of the plurality of low skew decode gates in the second decode stage.

13. The decoder of claim 10 wherein the plurality of low skew decode gates in the second decode stage comprise domino gates.

14. The decoder of claim 13 wherein at least one of the plurality of low skew decode gates in the second decode stage shares a clocked transistor with at least another one of the plurality of low skew decode gates in the second decode stage.

15. The decoder of claim 14 wherein
a secondary precharge device is coupled to an internal node of each of the domino gates.

16. The decoder of claim 13 wherein an output of each of the domino gates is coupled to an inverter to provide a wordline driver.

17. An apparatus comprising:
a predecode stage including
a plurality of low skew static decode gates, at least some of the low skew static decode gates sharing a transistor with at least one other of the low skew static decode gates, and
a high skew inverter coupled to an output of each of the plurality of low skew static decode gates, each of the high skew inverters to provide one bit of a predecode output signal, and
a final decode stage including
a plurality of wordline drivers, each of the plurality of wordline drivers to provide one bit of a final decoded output signal, each of the wordline drivers including
a skewed static logic gate coupled to receive at least one bit of the predecoded output signal, and
a domino gate coupled to receive at least one bit of the predecoded output signal and an output of the skewed static logic gate, the domino gate to provide one bit of a wordline signal at an output.

18. The apparatus of claim 17 wherein
the predecoder and wordline drivers are provided on a processor.

19. The apparatus of claim 17 wherein
the plurality of low skew static decode gates are precharged in response to data signals received at inputs of the low skew static decode gates.

20. A method comprising:
providing a decoder including a plurality of low skew decode gates, each low skew decode gate to provide one bit of a decoded output signal,
coupling a high skew gate at an output of each of the low skew gates; and
coupling at least two of the decode gates such that the at least two decode gates share a transistor.

21. A method comprising:
providing a decoder including a plurality of domino decode gates, each domino decode gate to provide one bit of a decoded output signal;
coupling at least two of the decode gates such that the at least two decode gates share a transistor; and
coupling a secondary precharge gate at an internal node of each of the plurality of domino gates.

* * * * *